United States Patent
Ho et al.

(10) Patent No.: US 8,178,418 B1
(45) Date of Patent: May 15, 2012

(54) METHOD FOR FABRICATING INTRA-DEVICE ISOLATION STRUCTURE

(75) Inventors: Jar-Ming Ho, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/093,726

(22) Filed: Apr. 25, 2011

(51) Int. Cl.
*H01L 21/76* (2006.01)

(52) U.S. Cl. ........ 438/445; 438/424; 438/425; 438/439; 257/E21.546

(58) Field of Classification Search .................. 438/424, 438/425, 439, 445
See application file for complete search history.

(56) References Cited

U.S. PATENT DOCUMENTS

| | | | |
|---|---|---|---|
| 6,436,611 B1* | 8/2002 | Lee | 430/314 |
| 8,048,762 B2* | 11/2011 | Ohuchi | 438/424 |
| 2006/0258109 A1* | 11/2006 | Juengling | 438/301 |
| 2007/0134884 A1* | 6/2007 | Kim et al. | 438/424 |
| 2008/0113483 A1* | 5/2008 | Wells | 438/424 |
| 2009/0004813 A1* | 1/2009 | Lee | 438/421 |
| 2009/0170276 A1* | 7/2009 | Kim | 438/421 |
| 2010/0155832 A1* | 6/2010 | Im | 257/330 |

* cited by examiner

Primary Examiner — Alexander Ghyka

(57) ABSTRACT

A method for fabricating intra-device isolation structure is provided, including providing a semiconductor substrate with a mask layer formed thereover. A plurality of first trenches is formed in the semiconductor substrate and the mask layer. A first insulating layer is formed in the first trenches. The mask layer is partially removed to expose a portion of the first insulating layer in the first trenches. A protection spacer is formed on a sidewall surface of the portion of the first insulating layer exposed by the mask layer to partially expose a portion of the mask layer between the first insulating layer. An etching process is performed to the mask layer exposed by the protection spacer and the semiconductor substrate thereunder, and a plurality of second trenches is formed in the semiconductor substrate and the mask layer. A second insulating layer is formed in the second trenches. The protection spacer, the mask layer, the first insulating layer and the second insulating layer over a top surface of the semiconductor substrate are then removed.

10 Claims, 6 Drawing Sheets

METHOD FOR FABRICATING INTRA-DEVICE ISOLATION STRUCTURE

BACKGROUND OF THE INVENTION

1. Field of the Invention

The present invention relates to semiconductor fabrication, and in particularly to a method for fabricating intra-device isolation structures.

2. Description of the Related Art

Modern integrated circuits are made up of literally millions of individual devices such as transistors and capacitors formed in a single semiconductor substrate such as a silicon substrate.

The individual devices are electrically isolated from one another through isolation structures made by various isolation techniques such as, local oxidation of silicon (LOCOS), recessed LOCOS and trench isolation techniques.

In addition to the isolation structures for electrically isolating the individual devices from one another, intra-device isolation structures are also needed to electrically isolate various components such as diffusion regions and conductive elements formed in the individual devices. The intra-device isolation structures can also be made by various isolation techniques such as, local oxidation of silicon (LOCOS), recessed LOCOS and trench isolation techniques.

BRIEF SUMMARY OF THE INVENTION

An exemplary method for fabricating intra-device isolation structure comprises providing a semiconductor substrate with a mask layer formed thereover. A plurality of first trenches is formed in the semiconductor substrate and the mask layer. A first insulating layer is formed in the first trenches. The mask layer is partially removed to expose a portion of the first insulating layer in the first trenches. A protection spacer is formed on a sidewall surface of the portion of the first insulating layer exposed by the mask layer to partially expose a portion of the mask layer between the first insulating layer. An etching process is performed to the mask layer exposed by the protection spacer and the semiconductor substrate thereunder, and a plurality of second trenches is formed in the semiconductor substrate and the mask layer. A second insulating layer is formed in the second trenches. The protection spacer, the mask layer, the first insulating layer and the second insulating layer over a top surface of the semiconductor substrate are then removed.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-5 are cross sections showing an exemplary method for fabricating intra-device isolation structures. Herein, the exemplary method is a method known by the inventors and is used as a comparative example to comment on the problems found by the inventors, but is not used to restrict the scope of the invention.

Figure 1:
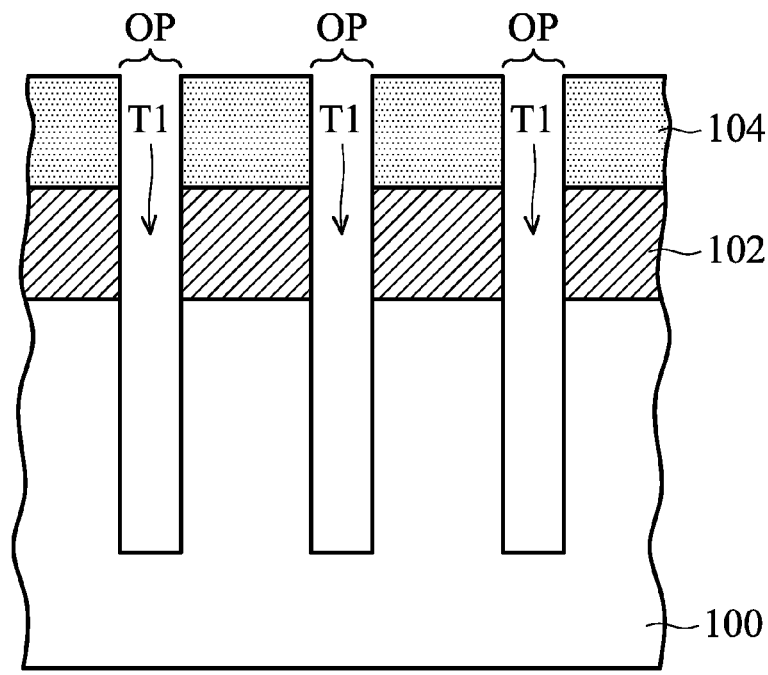
FIGS. 1-5 are cross sections showing a method for fabricating intra-device isolation structures according to an embodiment of the invention.

In FIG. 1, a semiconductor substrate 100 with a mask layer 102 formed thereover is first provided. The semiconductor substrate 100 can be, for example, a silicon substrate, and the mask layer 102 can be, for example, a polysilicon layer. Next, a patterned photoresist layer 104 with a plurality of openings OP formed therein is formed over the mask layer 102. An etching process (not shown) is then performed to etch portions of the mask layer 102 and the semiconductor substrate 100 exposed by the openings OP using the patterned photoresist layer 104 as an etching mask, thereby forming a plurality of trenches T1 in the mask layer 102 and the semiconductor substrate 100.

Figure 2:
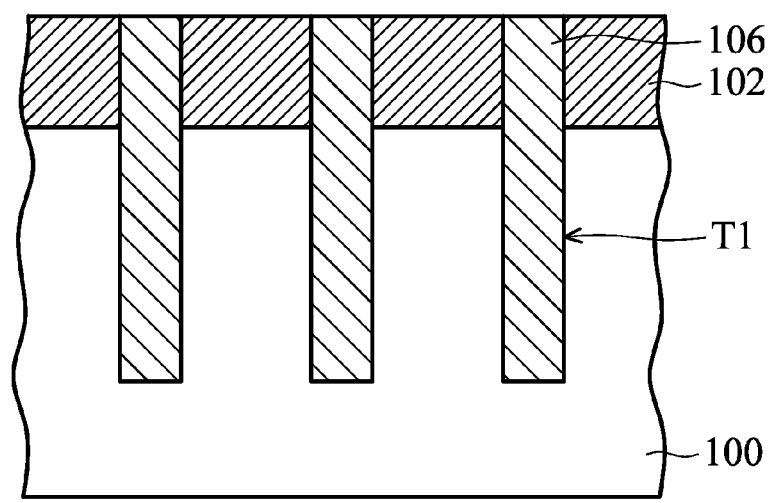
Figure 3:
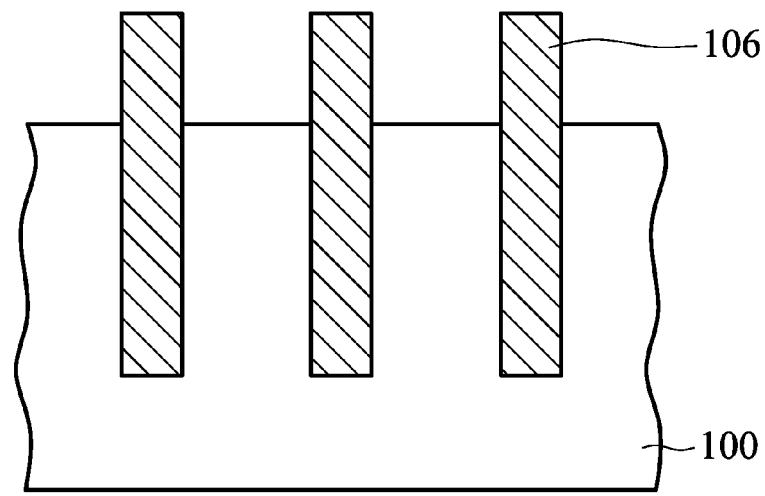

In FIG. 2, the patterned photoresist layer 104 is first removed, and an insulating material such as a silicon dioxide is then formed over the mask layer 102 and entirely fills the trenches T1. Next, a planarization process (not shown) is performed to remove portions of the insulating material above the mask layer 102, thereby forming an insulating layer 106 in each of the trenches T1. The insulating layer 106 formed in the trenches T1 functions as a device-to-device isolation structure for defining a plurality device regions over the semiconductor substrate 100, such as memory regions of a memory device. The mask layer 102 is then entirely removed by, for example, a wet etching process, thereby exposing portions of the insulation layers 106, respectively, as shown in FIG. 3, In FIG. 4, a layer of dielectric material (not shown) such as a silicon nitride layer is conformably formed over the semiconductor substrate 100 and surfaces of the exposed portions of the insulating layers 106 as shown in FIG. 3. The dielectric material is then etching by, for example, a dry etching process to form a dielectric spacer 108 on sidewall surfaces of the exposed portions of the insulating layers 106 and the dielectric spacer 108 partially exposes portions of the semiconductor substrate 100 adjacent thereto.

Next, an etching process (not shown) is performed to etch the semiconductor substrate 100 using the dielectric spacer 108 and the insulating layers 106 as an etching mask, thereby forming a trench T2 in the semiconductor substrate 100 between the trenches T1, respectively. In one embodiment, the trenches T2 are formed with a depth in the semiconductor substrate 100 less than a depth in the semiconductor substrate 100 of the previously formed trenches T1.

Figure 5:
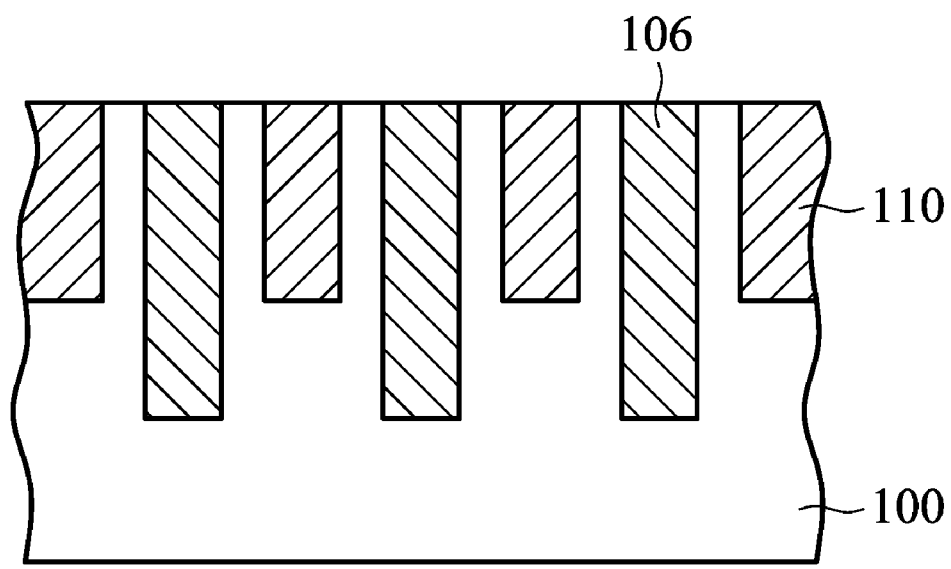

In FIG. 5, an insulating material (not shown) such as a silicon dioxide is blanketly formed over the semiconductor substrate 100, the dielectric spacers 108 and the insulating layers 106 to entirely fill the trenches T2. Next, the portion of the insulating material, the insulating layer 106, and the dielectric spacers 108 over a top surface of the semiconductor substrate 100 are then entirely removed to form an insulating layer 110 in each of the trenches T2. As shown in FIG. 5, after removal of the insulating layer 106 and the dielectric spacers 108 over the top surface of the semiconductor substrate 100, the insulating layers 106 is formed with a reduced thickness and is coplanar with the insulating layers 110 and the top surface of the semiconductor substrate 100. Device elements such as diffusion regions and conductive elements can be formed in or on the semiconductor substrate 100 between the insulating layers 110 and 106, thereby forming a plurality of devices (not shown) with predetermined functions over the semiconductor substrate 100.

Figure 4:
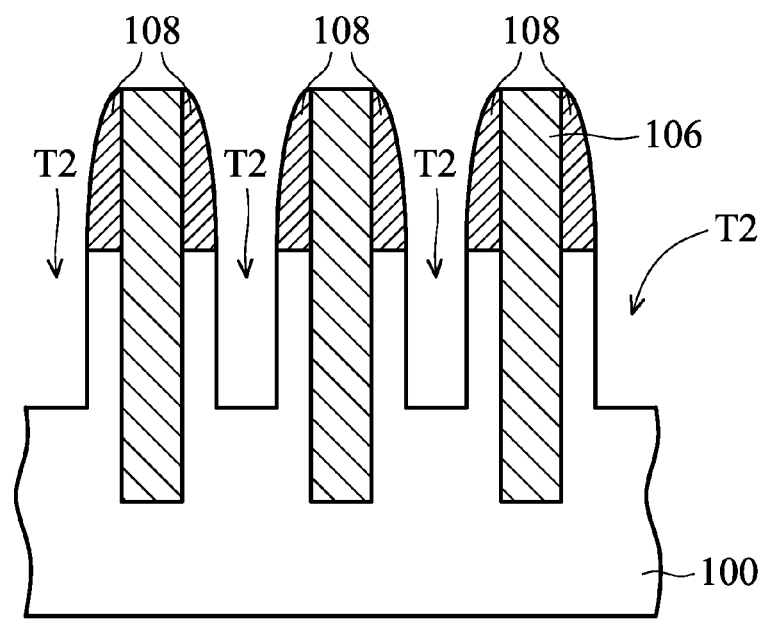

In the exemplary method as disclosed in FIGS. 1-5, since a dimension such as a width or a diameter of the insulating layers 106 will be further decreased with the shrinkage of a device region (e.g. as a region between the adjacent insulating layers 106), undesired wobbling issues may occur to the exposed portions of the insulating layers 106 as shown in FIG. 3 such that causes collapse thereof during processes for forming the dielectric spacers 108 and trenches T2 shown in FIG. 4. Accordingly, the method as disclosed in FIGS. 1-5 may be affected, causing unsatisfactory fabrication of the intra-device isolation structures (i.e. the insulating layers 110).

Thus, an improved method for fabricating intra-array isolation structures to address the above wobbling issues is needed.

FIGS. 6-10 are cross sections showing an exemplary method for fabricating intra-device isolation structures without the above wobbling issues.

Figure 6:
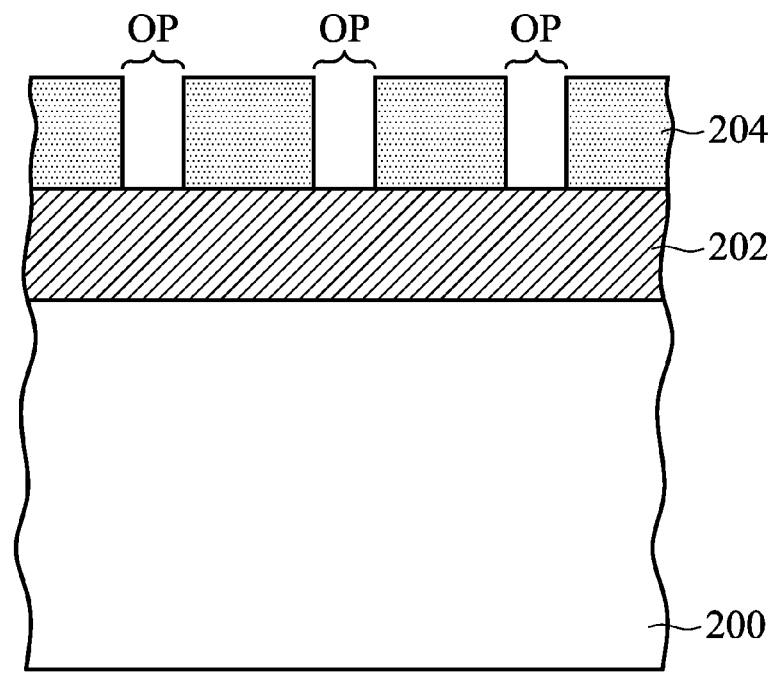
FIGS. 6-10 are cross sections showing a method for fabricating intra-device isolation structures according to another embodiment of the invention.

In FIG. 6, a semiconductor substrate 200 with a mask layer 202 formed thereover is first provided. The semiconductor substrate 200 can be, for example, a silicon substrate, and the mask layer 202 can be, for example, a silicon nitride layer. Next, a patterned photoresist layer 204 with a plurality of openings OP formed therein are formed over the mask layer 202.

Figure 7:
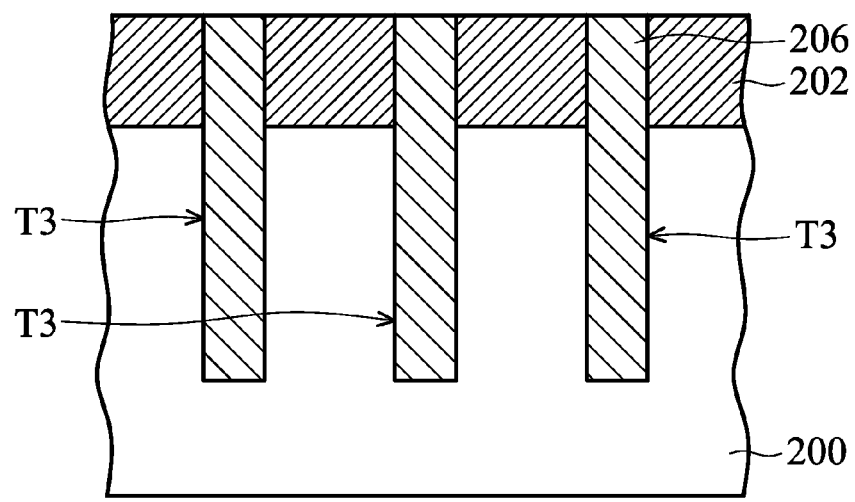

In FIG. 7, an etching process (not shown) is then performed to etch portions of the mask layer 202 and the semiconductor substrate 200 exposed by the openings OP using the patterned photoresist layer 204 (see FIG. 6) as an etching mask, thereby forming a plurality of trenches T3 in the mask layer 202 and the semiconductor substrate 200. Next, after formation of the trenches T3, the patterned photoresist layer 204 is first removed and an insulating material such as a silicon dioxide is formed over the mask layer 202 and entirely fills the trenches T3. Next, a planarization process (not shown) is performed to remove portions of the insulating material above the mask layer 202, thereby forming an insulating layer 206 in each of the trenches T3. The insulating layer 206 formed in the trenches D3 functions as a device-to-device isolation structure for defining a plurality device regions over the semiconductor substrate 200, such as memory regions of a memory device.

Figure 8:
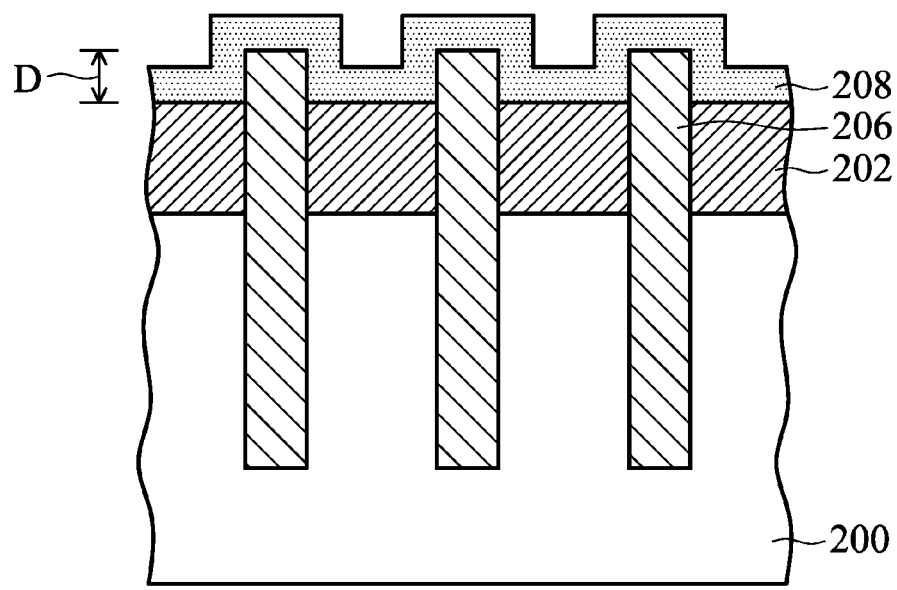

In FIG. 8, an etching process (not shown) is performed to partially remove the mask layer 202 and partially expose the insulating layers 206. A thickness D of about 100-500 Å of the mask layer 202 is removed in the etching process, and a thickness of about 100-500 Å of the insulating layers 206 is exposed. Next, a protect layer 208 is conformably formed over the mask layer 202 and the exposed portions of the insulating layers 206. The protect layer 208 may comprise materials such as TiN or $Al_2O_3$ which show great etching selectivity with respect to the mask layer 202.

Figure 9:
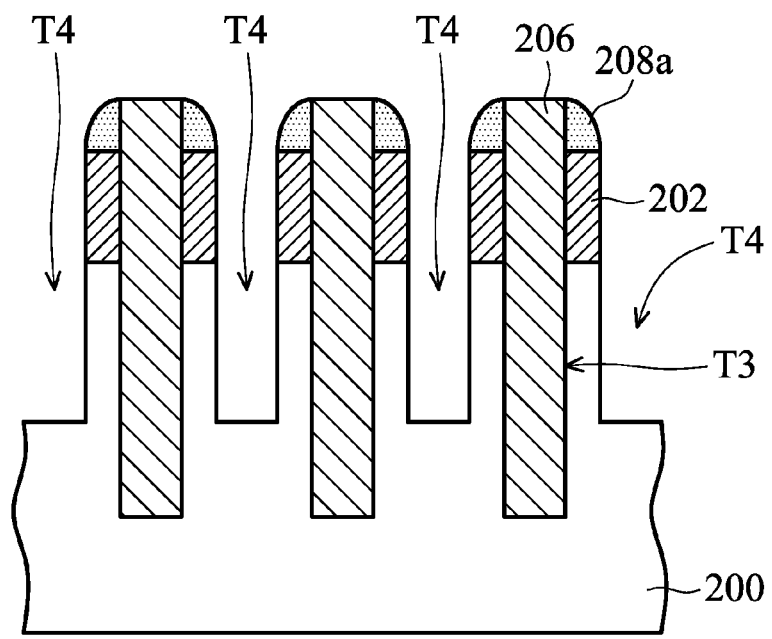

In FIG. 9, an etching process (not shown) is performed to etch back the protect layer 208 and to form a protection spacer 208a on each sidewall surface of the exposed portions of the insulating layer 206, and the protection spacer 208a partially exposes portions of the mask layer 202 adjacent thereto. Next, an etching process (not shown) is performed to etch the portion of the mask layer 202 exposed by the protection spacers 208a and the semiconductor substrate 200 thereunder, thereby forming a trench T4 in the mask layer 202 and the semiconductor substrate 200 between the adjacent trenches T3, respectively. In one embodiment, the trenches T4 are formed with a depth in the semiconductor substrate 200 less than a depth in the semiconductor substrate 200 of the previously formed trenches T3.

Figure 10:
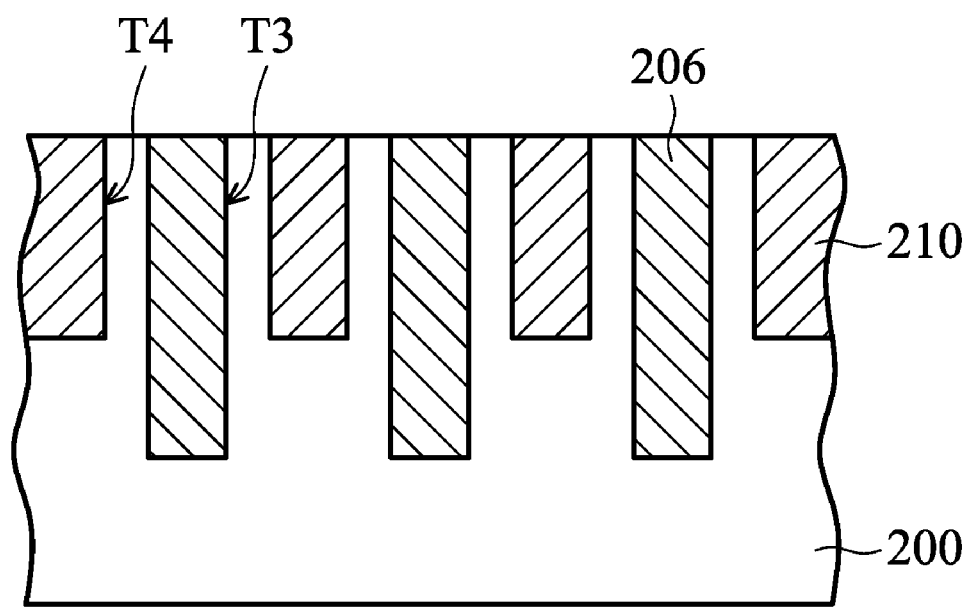

In FIG. 10, an insulating material such as a silicon dioxide is blanketly formed over the semiconductor substrate 200, the mask layer 202, the protection spacers 208a, and the insulating layers 206 to entirely fill the trenches T4. Next, the portion of the insulating material, the mask layer 202, the protection spacers 208, and the insulating layer 206 over a top surface the semiconductor substrate 200 are then entirely removed to form an insulating layer 210 in each of the trenches T4, respectively. As shown in FIG. 10, after removal of the portion of the insulating layer 206, the protection spacers 208 and the mask layer 202 over the top surface of the semiconductor substrate 200, the insulating layers 206 is formed with a reduced thickness and is coplanar with the insulating layers 210 and a top surface of the semiconductor substrate 200. Device elements such as diffusion regions and conductive elements can be formed in or on the semiconductor substrate 200 between the insulating layers 210 and 206, thereby forming a plurality of devices (not shown) of predetermined functions over the semiconductor substrate 200.

In the exemplary method disclosed by FIGS. 6-10, since the mask layer 202 is partially removed but not entirely removed as that shown in FIG. 2, the wobbling and collapse issues found in the exemplary method disclosed by FIGS. 1-5 can be prevented while a dimension such as a width or a diameter of the insulating layers 206 can be further decreased with the shrinkage of a device region (e.g. a region between the adjacent insulating layers 206). Fabrication of the insulating layers 210, which function as intra-device isolations can be thus ensured by the exemplary method disclosed in FIGS. 6-10. In addition, by using the protection spacers 208a, formation of the trenches T4 for accommodating the insulating layer 210 can be formed by self-alignment, without any additional photomasks required for patterning thereof.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating intra-device isolation structures, comprising:
    providing a semiconductor substrate with a mask layer formed thereover;
    forming a plurality of first trenches in the semiconductor substrate and the mask layer;
    forming a first insulating layer in the first trenches;
    partially remove the mask layer and exposing a portion of the first insulating layer in the first trenches;
    forming a protection spacer on a sidewall surface of the portion of the first insulating layer exposed by the mask layer, partially exposing a portion of the mask layer between the first insulating layer;
    performing an etching process to the mask layer exposed by the protection spacer and the semiconductor substrate thereunder, forming a plurality of second trenches in the semiconductor substrate and the mask layer;
    forming a second insulating layer in the second trenches; and
    removing the protection spacer, the mask layer, the first insulating layer and the second insulating layer over a top surface of the semiconductor substrate.

2. The method as claimed in claim 1, wherein the first trenches in the semiconductor substrate has a depth deeper than that of the second trenches in the semiconductor substrate.

3. The method as claimed in claim 1, wherein the mask layer comprises silicon nitride and the protection spacer comprise TiN.

4. The method as claimed in claim 1, wherein the first insulating layer formed in the first trenches defines a plurality of device regions over the semiconductor substrate.

5. The method as claimed in claim 4, wherein the second insulating layer formed in the second trenches functions as an intra-device isolation structure.

6. The method as claimed in claim 1, wherein a thickness of about 100-150 Å of the portion of the first insulating layer in the first trenches is exposed during partially removing the mask layer.

7. The method as claimed in claim 1, wherein the first insulating layer comprises silicon dioxide.

8. The method as claimed in claim 1, wherein the second insulating layer comprises silicon dioxide.

9. The method as claimed in claim 1, wherein after removal of the protection spacer, the mask layer, the first insulating layer and the second insulating layer over the top surface of the semiconductor substrate, the first insulating layer and the second insulating layer are coplanar with the top surface of the semiconductor substrate.

10. The method as claimed in claim 1, wherein the semiconductor substrate is a silicon substrate.

* * * * *